(12) United States Patent
Sugiyama et al.

(10) Patent No.: US 10,916,281 B2
(45) Date of Patent: Feb. 9, 2021

(54) MAGNETIC MEMORY APPARATUS

(71) Applicant: KABUSHIKI KAISHA TOSHIBA, Tokyo (JP)

(72) Inventors: Hideyuki Sugiyama, Kanagawa (JP); Kazutaka Ikegami, Tokyo (JP); Naoharu Shimomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/299,861

(22) Filed: Mar. 12, 2019

(65) Prior Publication Data
US 2020/0035280 A1 Jan. 30, 2020

(30) Foreign Application Priority Data

Jul. 30, 2018 (JP) ................................. 2018-142923

(51) Int. Cl.
*G11C 11/16* (2006.01)
*H01L 43/02* (2006.01)
*H01L 27/22* (2006.01)
*H01L 43/10* (2006.01)

(52) U.S. Cl.
CPC ........ *G11C 11/161* (2013.01); *G11C 11/1659* (2013.01); *H01L 27/228* (2013.01); *H01L 43/02* (2013.01); *H01L 43/10* (2013.01)

(58) Field of Classification Search
CPC . G11C 11/161; G11C 11/1659; H01L 27/228; H01L 43/02; H01L 43/10
See application file for complete search history.

(56) References Cited

U.S. PATENT DOCUMENTS

| 6,226,197 | B1* | 5/2001 | Nishimura | ............. | B82Y 10/00 |
| | | | | | 257/E21.665 |
| 6,947,314 | B2* | 9/2005 | Yoda | ....................... | G11C 11/15 |
| | | | | | 365/158 |
| 8,048,492 | B2* | 11/2011 | Fukuzawa | ............. | B82Y 25/00 |
| | | | | | 427/532 |
| 2002/0172073 | A1* | 11/2002 | Hidaka | ................... | G11C 11/16 |
| | | | | | 365/158 |

(Continued)

FOREIGN PATENT DOCUMENTS

JP 6089081 B1 3/2017
JP 2017-112351 A 6/2017

*Primary Examiner* — Khamdan N. Alrobaie
(74) *Attorney, Agent, or Firm* — Finneean, Henderson, Farabow, Garrett & Dunner, L.L.P.

(57) ABSTRACT

According to one embodiment, a magnetic memory apparatus includes a first stacked body and a controller. The first stacked body includes a first magnetic layer, a first counter magnetic layer, and a first intermediate layer placed between the first magnetic layer and the first counter magnetic layer. The first intermediate layer is nonmagnetic. The controller is electrically connected to the first magnetic layer and the first counter magnetic layer. The controller is configured to perform a first operation of supplying first pulse current to the first stacked body. The first pulse current includes a first constant-current period. A first electrical resistance value of the first stacked body before the supply of the first pulse current is different from a second electrical resistance value of the first stacked body after the supply of the first pulse current.

17 Claims, 6 Drawing Sheets

(56) References Cited

U.S. PATENT DOCUMENTS

| | | | |
|---|---|---|---|
| 2004/0052006 A1* | 3/2004 | Odagawa | B82Y 10/00 |
| | | | 360/324.1 |
| 2004/0114275 A1* | 6/2004 | Ezaki | G11C 11/16 |
| | | | 360/110 |
| 2006/0067111 A1* | 3/2006 | Ezaki | G11C 11/16 |
| | | | 365/158 |
| 2006/0233017 A1* | 10/2006 | Hosotani | G11C 11/15 |
| | | | 365/158 |
| 2007/0007609 A1* | 1/2007 | Saito | G11C 11/15 |
| | | | 257/421 |
| 2007/0097736 A1* | 5/2007 | Inokuchi | G11C 11/16 |
| | | | 365/158 |
| 2016/0267956 A1* | 9/2016 | Park | G11C 11/161 |
| 2017/0077177 A1* | 3/2017 | Shimomura | H01L 27/11582 |
| 2017/0169872 A1 | 6/2017 | Yoda et al. | |
| 2018/0114898 A1* | 4/2018 | Lee | H01L 43/02 |
| 2018/0174635 A1* | 6/2018 | Yoda | G11C 11/161 |
| 2018/0240845 A1* | 8/2018 | Yang | G11C 11/1659 |
| 2018/0277746 A1* | 9/2018 | Abe | G11C 11/1659 |

\* cited by examiner

MAGNETIC MEMORY APPARATUS

CROSS-REFERENCE TO RELATED APPLICATIONS

This application is based upon and claims the benefit of priority from Japanese Patent Application No. 2018-142923, filed on Jul. 30, 2018; the entire contents of which are incorporated herein by reference.

FIELD

Embodiments described herein relate generally to a magnetic memory apparatus.

BACKGROUND

There is a magnetic memory apparatus that uses a magnetic layer. Stable operations of the magnetic memory apparatus are desirable

DETAILED DESCRIPTION

Figure 1:
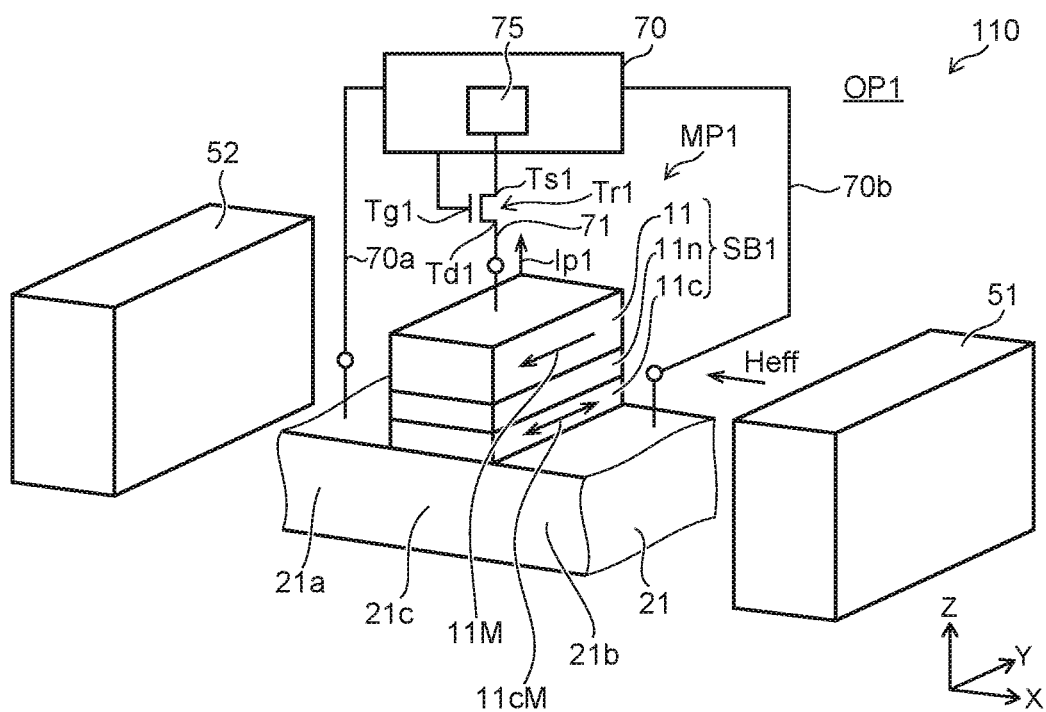
FIG. 1 is a schematic perspective view illustrating a magnetic memory apparatus according to a first embodiment.

According to one embodiment, a magnetic memory apparatus includes a first stacked body and a controller. The first stacked body includes a first magnetic layer, a first counter magnetic layer, and a first intermediate layer placed between the first magnetic layer and the first counter magnetic layer. The first intermediate layer is nonmagnetic. The controller is electrically connected to the first magnetic layer and the first counter magnetic layer. The controller is configured to perform a first operation of supplying first pulse current to the first stacked body. The first pulse current includes first constant-current period. A first electrical resistance value of the first stacked body before the supply of the first pulse current is different from a second electrical resistance value of the first stacked body after the supply of the first pulse current.

According to another embodiment, a magnetic memory apparatus includes a first stacked body, a first transistor, and a controller. The first stacked body includes a first magnetic layer, a first counter magnetic layer, and a first intermediate layer placed between the first magnetic layer and the first counter magnetic layer, the first intermediate layer being nonmagnetic. The first transistor is electrically connected to the first magnetic layer. The controller is electrically connected to the first transistor and the first counter magnetic layer. The controller is configured to perform a first operation of supplying first pulse current to the first stacked body via the first transistor. The first transistor operates in a saturated region. A first electrical resistance value of the first stacked body before the supply of the first pulse current is different from a second electrical resistance value of the first stacked body after the supply of the first pulse current.

Various embodiments are described below with reference to the accompanying drawings.

The drawings are schematic and conceptual; and the relationships between the thickness and width of parts, the proportions of sizes among parts, etc., are not necessarily the same as the actual values. The dimensions and proportions may be illustrated differently among drawings, even for identical parts.

In the specification and drawings, components similar to those described previously or illustrated in an antecedent drawing are marked with like reference numerals, and a detailed description is omitted as appropriate.

First Embodiment

FIG. 1 is a schematic perspective view illustrating a magnetic memory apparatus according to a first embodiment.

As shown in FIG. 1, the magnetic memory apparatus 110 according to the embodiment includes a first stacked body SB1 and a controller 70. A first conductive layer 21, a first transistor Tr1, and a magnetic part (a first magnetic part 51 and a second magnetic part 52) are placed in the example.

The first stacked body SB1 includes a first magnetic layer 11, a first counter magnetic layer 11c, and a first intermediate layer 11n. The first intermediate layer 11n is placed between the first magnetic layer 11 and the first counter magnetic layer 11c. The first intermediate layer is nonmagnetic. The first magnetic layer 11 and the first counter magnetic layer 11c are, for example, ferromagnetic. Other layers may be inserted between the first magnetic layer 11 and the first intermediate layer 11n. Other layers may be inserted between the first counter magnetic layer 11c and the first intermediate layer 11n.

The controller 70 is electrically connected to the first stacked body SB1. In one example, the controller 70 includes a constant-current source 75.

For example, the first conductive layer 21 includes a first part 21a, a second part 21b, and a third part 21c. The third part 21c is placed between the first part 21a and the second part 21b. The first part 21a, the second part 21b, and the third part 21c are continuous with each other.

For example, the first counter magnetic layer 11c is placed between the third part 21c and the first magnetic layer 11. The first conductive layer 21 is electrically connected to the first counter magnetic layer 11c. In one example, the first conductive layer 21 (the third part 21c) is connected to the first counter magnetic layer 11c.

In the case that the first conductive layer 21 is provided, the controller 70 is electrically connected to the first conductive layer 21. In the example, the controller 70 is electrically connected to the first part 21a by an wire 70a. The controller 70 is electrically connected to the second part 21b by an wire 70b. A switch such as a transistor or the like may be placed in either the wire 70a or the wire 70b or both of them.

The first transistor Tr1 is electrically connected to the first magnetic layer 11. In the example, the first transistor Tr1 and the first magnetic layer 11 are electrically connected by an wire 71.

The first transistor Tr1 includes a first gate Tg1, a first source Ts1, and a first drain Td1. For example, the first drain Td1 is electrically connected to the first magnetic layer 11. The first source Ts1 is electrically connected to the constant-current source 75. The first gate Tg1 is electrically connected to the controller 70.

In the case that the first transistor Tr1 is provided, the controller 70 is electrically connected to the first transistor Tr1 and the first counter magnetic layer 11c (the first conductive layer 21 in the case that the first conductive layer 21 is provided).

A first direction from the first counter magnetic layer 11c to the first magnetic layer 11 is taken as a Z-axis direction. One direction perpendicular to the Z-axis direction is taken as an X-axis direction. A direction perpendicular to the Z-axis direction and the X-axis direction is taken as a Y-axis direction.

A second direction from the first part 21a to the second part 21b of the first conductive layer 21 crosses the first direction. In the example, the second direction is the X-axis direction. For example, the first conductive layer 21 extends along the X-axis direction.

For example, the first stacked body SB1 corresponds to one memory cell. As described below, multiple stacked bodies may be provided. A first memory part MP1 is obtained from the first conductive layer 21 and one or multiple stacked bodies. Multiple memory parts may be provided.

An example of operations of one stacked body SB1 is described below.

The controller 70 is configured to perform a first operation OP1. In the first operation OP1, the controller 70 supplies first pulse current Ip1 including a constant-current period to the first stacked body SB1. For example, a first electrical resistance value of the first stacked body SB1 before supplying the first pulse current Ip1 is different from a second electrical resistance value of the first stacked body SB1 after supplying the first pulse current Ip1. For example, the first electrical resistance value described above is higher than the second electrical resistance value described above.

For example, the change of the electrical resistance value is based on the magnetoresistance effect. The first stacked body SB1 is, for example, a MTJ (Magnetic Tunnel Junction) device. A high resistance value and a low resistance value correspond to information as one bit.

For example, the first magnetic layer 11 has magnetization 11M. The first counter magnetic layer 11c has magnetization 11cM. In one example, the magnetization 11M of the first magnetic layer 11 crosses a plane (the Z-X plane) including the first direction and the second direction. For example, the magnetization 11M has a Y-axis direction component. The magnetization 11M may be aligned with the Y-axis direction. For example, the orientation of the magnetization 11cM of the first counter magnetic layer 11c can change to "parallel" or "antiparallel" to the magnetization 11M of the first magnetic layer 11. For "parallel," the magnetization 11cM has a component in the same orientation as the magnetization 11M. For "antiparallel," the magnetization 11cM has a component in the reverse orientation of the magnetization 11M.

For example, the electrical resistance value between the first magnetic layer 11 and the first counter magnetic layer 11c for "antiparallel" is higher than the electrical resistance value between the first magnetic layer 11 and the first counter magnetic layer 11c for "parallel."

For example, in the first operation OP1, the state before supplying the first pulse current Ip1 corresponds to the "antiparallel" state. For example, the state after supplying the first pulse current Ip1 corresponds to the "parallel" state.

For example, a magnetic field Heff is applied to the first stacked body SB1. The magnetic field Heff has a component crossing the direction (the first direction) from the first counter magnetic layer 11c to the first magnetic layer 11. In the example, the magnetic field Heff has an X-axis direction component. For example, the magnetic part(s) (either the first magnetic part 51 or the second magnetic part 52, or both of them) can apply the magnetic field Heff to the first stacked body SB1. In the example, the first stacked body SB1 (and the first conductive layer 21) are placed between the first magnetic part 51 and the second magnetic part 52. The magnetic field Heff is generated between the first magnetic part 51 and the second magnetic part 52. The magnetic part may be included in the magnetic memory apparatus 110. The magnetic part may be placed separately from the magnetic memory apparatus 110. Either the first magnetic part 51 or the second magnetic part 52 or both of them may be provided as the magnetic part.

It is considered that the magnetization 11cM of the first counter magnetic layer 11c has two stable states (a first state and a second state). For example, the first state is "antiparallel;" and the second state is "parallel." There is potential barrier between the first state and the second state. It is considered that the potential barrier between these two states decreases in the case that the initial state is the first state and higher voltage than a threshold value is applied to the first stacked body SB1. In the case that the magnetic field Heff described above is applied to the first counter magnetic layer 11c, the magnetization 11cM of the first counter magnetic layer 11c precesses. Thereby, the magnetization 11cM transitions from the first state to the second state. It is considered that the second state transitions back to the first state if applying the voltage described above is continued at this time. In such a case, it is difficult to stably obtain the second state because the obtained state changes according to the applying time of the voltage.

In the embodiment as described above, the first pulse current that is supplied to the first stacked body SB1 by the controller 70 includes the constant-current period (the constant-current state). Thereby, the return from the second state to the first state after the transition from the first state to the second state can be suppressed. Thereby, a magnetic memory apparatus can be provided in which stable operations are available.

Examples of the characteristics are described below.

Figure 2A:
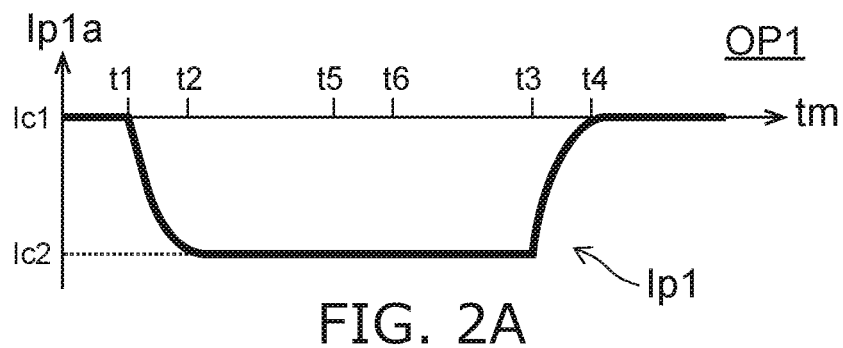
FIG. 2A to FIG. 2C are graphs illustrating an operation of the magnetic memory apparatus according to the first embodiment.
Figure 2B:
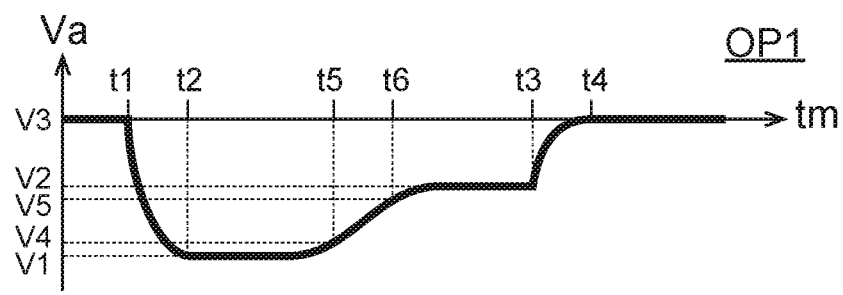
Figure 2C:
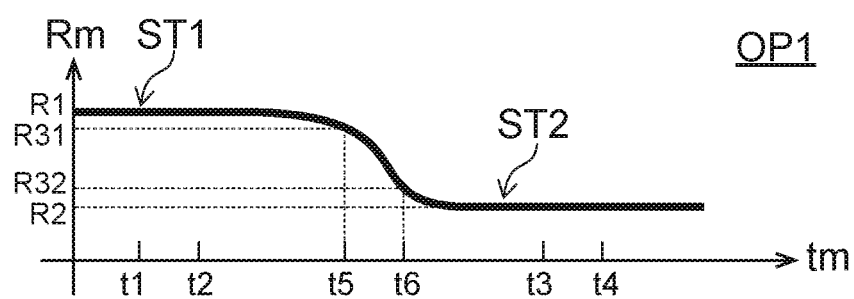

FIG. 2A to FIG. 2C are graphs illustrating an operation of the magnetic memory apparatus according to the first embodiment.

In FIG. 2A to FIG. 2C, the horizontal axis is time tm. The vertical axis of FIG. 2A corresponds to current magnitude Ip1a in the first pulse current Ip1. The vertical axis of FIG. 2B corresponds to potential difference Va (the device voltage) between the first magnetic layer 11 and the first counter magnetic layer 11c. The vertical axis of FIG. 2C corresponds to an electrical resistance value Rm between the first magnetic layer 11 and the first counter magnetic layer 11c. The electrical resistance value Rm corresponds to the electrical resistance value of the first stacked body SB1.

As shown in FIG. 2A, the magnitude Ip1a in the first pulse current Ip1 (the magnitude of the current) changes from a first current value Ic1 to a second current value Ic2 between first time t1 and second time t2. The second time t2 is later than the first time t1. The period between the first time t1 and the second time t2 is the rise period in the first pulse current Ip1.

The magnitude Ip1a in the first pulse current Ip1 is substantially constant between the second time t2 and third time t3. The third time t3 is later than the second time. The period between the second time t2 and the third time t3 is the constant-current period (the first constant-current period) in the first pulse current Ip1. Due to various factors, the magnitude Ip1a in the first pulse current Ip1 may fluctuate slightly between the second time t2 and the third time t3. The average value of the magnitude Ip1a in the first pulse current Ip1 between the second time t2 and the third time t3 may be used as the second current value Ic2.

The magnitude Ip1a in the first pulse current Ip1 changes from the second current value Ic2 to the first current value Ic1 between the third time t3 and fourth time t4. The fourth time t4 is later than the third time t3. The period between the third time t3 and the fourth time t4 is the fall period in the first pulse current Ip1.

Thus, the constant-current first pulse current Ip1 includes the rise period, the fall period, and the constant-current period (the first constant-current period).

In one example, the absolute value of the difference (a first difference) between the magnitude Ip1a in the first pulse current Ip1 and the second current value Ic2 (e.g., the average value) is less than 1/10 of the absolute value of the difference (a second difference) between the first current value Ic1 and the second current value Ic2 between the second time t2 and the third time t3 (in the constant-current period). In another example, the absolute value of the first difference may be less than 1/50 of the absolute value of the second difference. The magnitude Ip1a in the first pulse current Ip1 in the constant-current period substantially does not change in an even case that the electrical load resistance value (e.g., that of the first stacked body SB1) changes.

FIG. 2C shows the change of the electrical resistance value Rm of the first stacked body SB1 in the case that such first pulse current Ip1 is supplied to the first stacked body SB1. The electrical resistance value Rm before the first time t1 is taken as a first electrical resistance value R1. The electrical resistance value Rm after the fourth time t4 is taken as a second electrical resistance value R2. A first intermediate resistance value R31 and a second intermediate resistance value R32 are determined as follows. R31=R1−0.1×(R1−R2). R32=R2+0.1×(R1−R2). As the electrical resistance value Rm changes from the first electrical resistance value R1 to the second electrical resistance value R2, the time when the electrical resistance value Rm becomes the first intermediate resistance value R31 is taken as fifth time t5. As the electrical resistance value Rm changes from the first electrical resistance value R1 to the second electrical resistance value R2, the time when the electrical resistance value Rm becomes the second intermediate resistance value R32 is taken as sixth time t6.

The electrical resistance value Rm of the first stacked body SB1 changes steeply from the first electrical resistance value R1 to the second electrical resistance value R2 between the fifth time t5 and the sixth time t6. The fifth time t5 is between the second time t2 and the third time t3. The sixth time t6 is between the fifth time t5 and the third time t3.

The first electrical resistance value R1 corresponds to the first state ST1. The second electrical resistance value R2 corresponds to the second state ST2.

For example, a reference example may be considered in which the first pulse current Ip1 that includes the constant-current period is not applied; rather, pulse voltage that has higher constant-voltage than a threshold value is applied to the first stacked body SB1. In the reference example, when applying the voltage is continued after the first electrical resistance value R1 transitions to the second electrical resistance value R2, the electrical resistance value Rm changes back from the second electrical resistance value R2 to the first electrical resistance value R1. For example, the second electrical resistance value R2 easily transitions back to the first electrical resistance value R1 if the applying time of the voltage is longer than 1.5 times of the time of the transition from the first electrical resistance value R1 to transition to the second electrical resistance value R2 (e.g., the length of time between the first time t1 and the fifth time t5).

Conversely, by the first pulse current Ip1 in the embodiment, constant current is supplied in the period between the second time t2 and the third time t3. The absolute value of the voltage applied to the first stacked body SB1 decreases when the electrical resistance value transitions to the second electrical resistance value R2 (e.g., the "parallel" state) at the fifth time t5. Therefore, it is considered that the return from the second electrical resistance value R2 to the first electrical resistance value R1 is suppressed.

First voltage V1 shown in FIG. 2B corresponds to the product of the second current value Ic2 and the first electrical resistance value R1. Second voltage V2 shown in FIG. 2B corresponds to the product of the second current value Ic2 and the second electrical resistance value R2.

As shown in FIG. 2B, the potential difference Va at the fifth time t5 is taken as potential difference V4. As shown in FIG. 2B, the potential difference Va at the sixth time t6 is taken as potential difference V5. The potential difference Va changes steeply from the potential difference V4 to the potential difference V5 between the fifth time t5 and the sixth time t6. As described above, the fifth time t5 is between the second time t2 and the third time t3. As described above, the sixth time t6 is between the fifth time t5 and the third time t3. The absolute value of the second voltage V2 is less than the absolute value of the first voltage V1.

Thus, in the embodiment, the first pulse current Ip1 includes the constant-current period; therefore, the voltage applied to the first stacked body SB1 changes according to the transition (the switching) from the first state ST1 to the second state ST2. The phenomenon of returning to the first state is suppressed by reducing the absolute value of the voltage. Thereby, a magnetic memory apparatus can be provided in which stable operations are available.

As shown in FIG. 2B, the absolute value of the voltage (the potential difference Va) applied to the first stacked body SB1 decreases due to the switching. For example, the device voltage (the potential difference Va) is third voltage V3 before the first time t1. The device voltage (the potential difference Va) is the third voltage V3 after the fourth time t4. The absolute value of the difference between the third voltage V3 and the first voltage V1 is greater than the absolute value of the difference between the third voltage V3 and the second voltage V2.

An example of the change of the potential due to the switching described above is described below.

FIG. 3A to FIG. 3D are schematic views illustrating an operation of the magnetic memory apparatus according to the first embodiment.

Figure 3A:
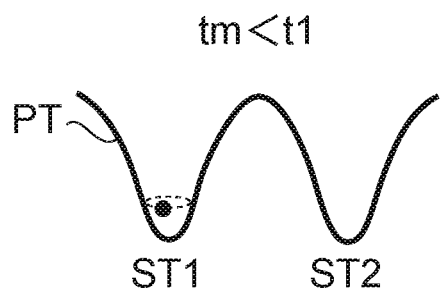
FIG. 3A to FIG. 3D are schematic views illustrating an operation of the magnetic memory apparatus according to the first embodiment.
Figure 3B:
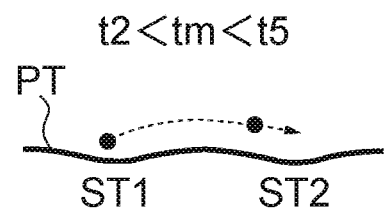
Figure 3C:
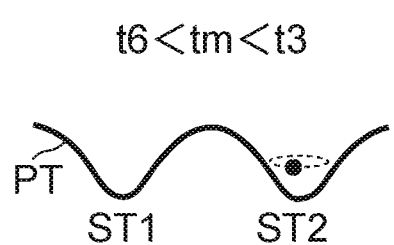
Figure 3D:
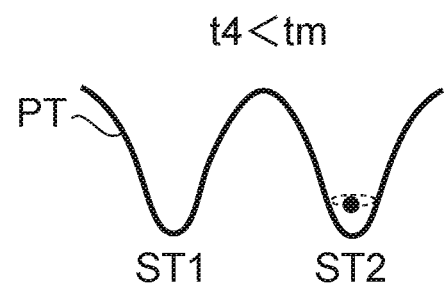

FIG. 3A to FIG. 3D schematically illustrate potential PT relating to the orientation of the magnetization 11cM of the first counter magnetic layer 11c. FIG. 3A corresponds to the state in which the time tm is earlier than the first time t1. FIG. 3B corresponds to the state in which the time tm is later than the second time t2 and earlier than the fifth time t5. FIG. 3C corresponds to the state in which the time tm is later than the sixth time t6 and earlier than the third time t3. FIG. 3D corresponds to the state in which the time tm is later than the fourth time t4.

As shown in FIG. 3A, the state is the first state ST1 (e.g., "antiparallel") before the time tm becomes the second time t2. As shown in FIG. 3B, the potential barrier of the potential PT decreases when the first pulse current Ip1 is supplied. Thereby, a transition to the second state ST2 (e.g., "parallel") occurs. As shown in FIG. 3C, the potential barrier increases when the state becomes the second state ST2. The increase of the potential barrier is caused by the decrease of the voltage applied to the first stacked body SB1. As shown in FIG. 3D, the potential barrier is high after the sixth time t6 after the second state ST2 is obtained. Therefore, the transition from the second state ST2 to the first state ST1 is suppressed.

For example, the first pulse current Ip1 described above is negative based on the potential of the first counter magnetic layer 11c. In the case that the first conductive layer 21 is provided, for example, the first pulse current Ip1 described above is negative based on the potential of the first conductive layer 21. The region of the first magnetic layer 11 on the first intermediate layer 11n-side has negative polarity due to the negative first pulse current Ip1. On the other hand, the region of the first counter magnetic layer 11c on the first intermediate layer 11n-side has positive polarity. Due to such polarities, the potential barrier of the potential PT is reduced easily.

In the magnetic memory apparatus 110 as described above, the transition (the first operation OP1) from the first electrical resistance value R1 (the first state ST1) to the second electrical resistance value R2 (the second state ST2) is performed stably. In the embodiment, a transition (a second operation) from the second electrical resistance value R2 (the second state ST2) to the first electrical resistance value R1 (the first state ST1) may be performed by use of any method.

One example of the second operation is described below.

Figure 4:
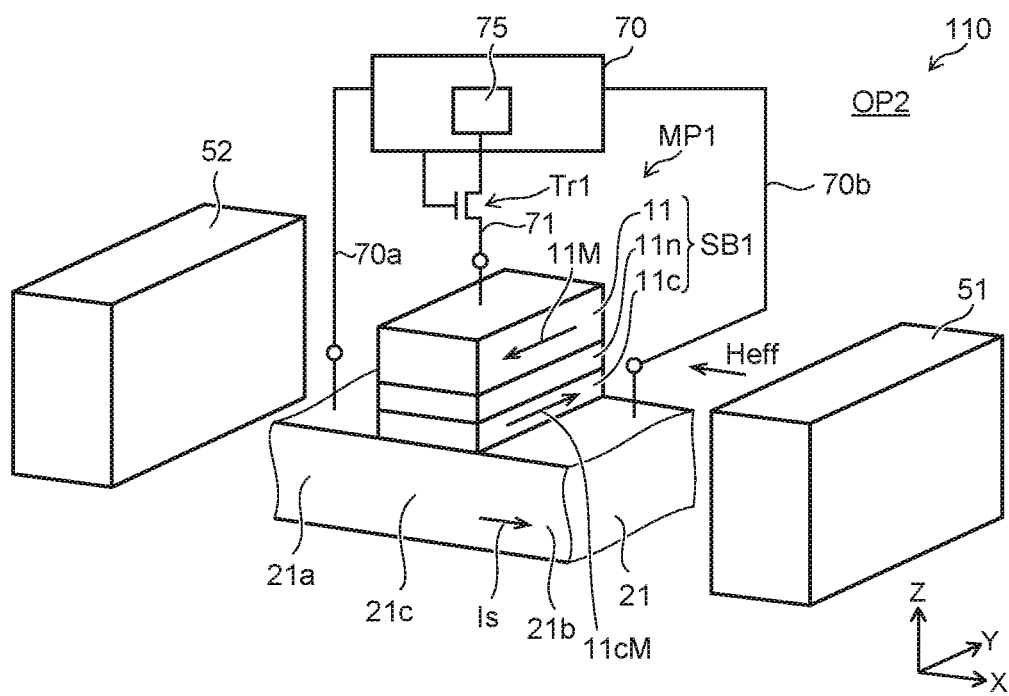
FIG. 4 is a schematic perspective view illustrating an operation of the magnetic memory apparatus according to the first embodiment.

FIG. 4 is a schematic perspective view illustrating an operation of the magnetic memory apparatus according to the first embodiment.

As shown in FIG. 4, the first conductive layer 21 is provided in the magnetic memory apparatus 110. As described above, the first conductive layer 21 includes the first part 21a, the second part 21b, and the third part 21c placed between the first part 21a and the second part 21b. The first counter magnetic layer 11c is placed between the third part 21c and the first magnetic layer 11.

In one example, the first conductive layer 21 includes at least one selected from the group consisting of Hf, Ta, W, Re, Os, Ir, Pt, Au, Bi, Pd, Cu, and Ag.

The controller 70 can further perform a second operation OP2. In the second operation OP2, the controller 70 supplies conductive layer current Is between the first part 21a and the second part 21b. The conductive layer current Is has the orientation from the first part 21a to the second part 21b or the orientation from the second part 21b to the first part 21a. The orientation of the magnetization 11cM of the first counter magnetic layer 11c can be controlled by the conductive layer current Is.

For example, the spin Hall effect is generated in the first conductive layer 21 by the conductive layer current Is flowing in the first conductive layer 21; and spin torque acts on the first counter magnetic layer 11c. The action changes the orientation of the magnetization 11cM. In the second operation OP2, the controller 70 sets the first magnetic layer 11 to potential that is negative based on the potential of the first conductive layer 21, and supplies the conductive layer current Is. Thereby, the potential barrier of the potential PT decreases; and the orientation of the magnetization 11cM easily becomes antiparallel.

For example, the first state ST1 (e.g., the "antiparallel" state) of the first electrical resistance value R1 is obtained by performing the second operation OP2 such as that described above. Subsequently, the first operation OP1 is performed according to the stored information. The second state ST2 (e.g., the "parallel" state) of the second electrical resistance value R2 is obtained by performing the first operation OP1. The first state ST1 (e.g., the "antiparallel" state) of the first electrical resistance value R1 is obtained if the first operation OP1 is not performed. Thus, the first operation OP1 is performed after the second operation OP2.

In the case that the first conductive layer 21 described above and the magnetic part described above are provided, the magnetic field Heff is aligned with a direction (e.g., the X-axis direction) passing through the first part 21a and the second part 21b. The magnetic part described above can apply the magnetic field Heff to the first stacked body SB1. The magnetic part described above includes, for example, either the first magnetic part 51 or the second magnetic part 52 or both of them. For example, the direction that passes through the first part 21a and the second part 21b is aligned with the direction passing through the first magnetic part 51 and the second magnetic part 52.

Figure 5A:
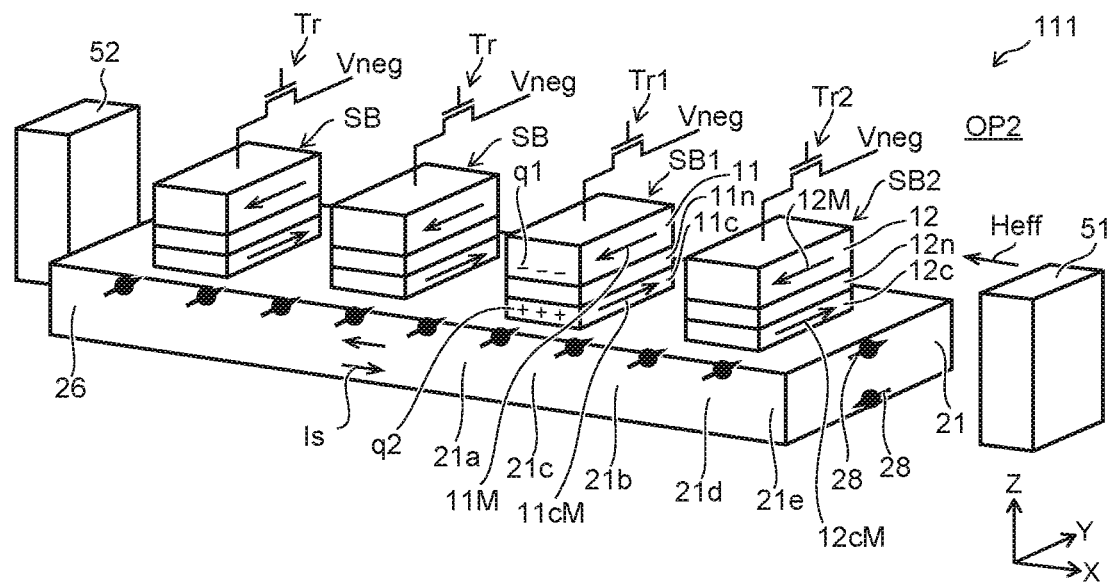
FIG. 5A and FIG. 5B are schematic perspective views illustrating a magnetic memory apparatus according to the first embodiment.
Figure 5B:
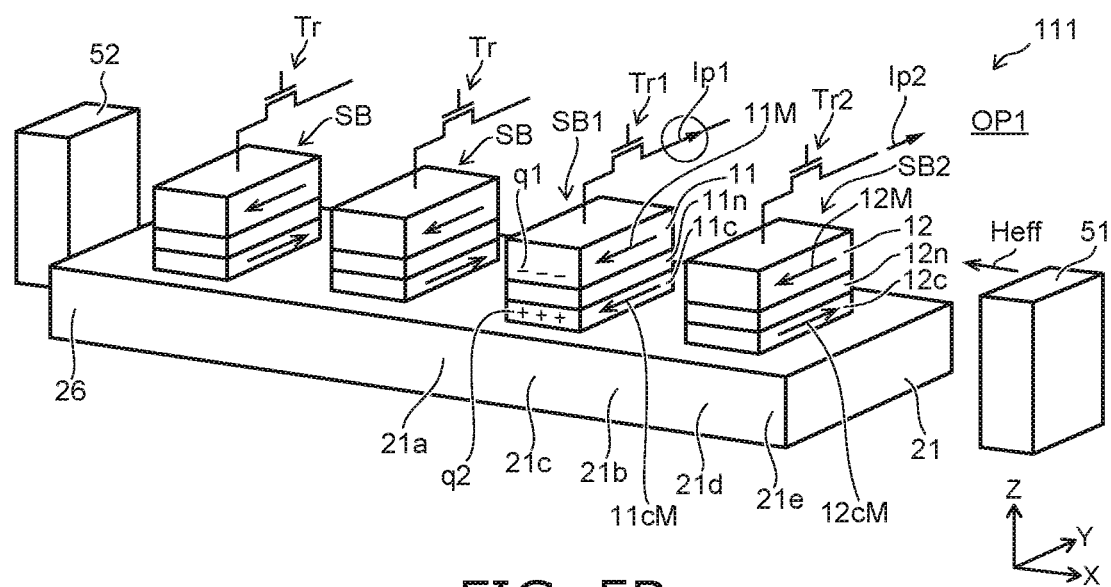

FIG. 5A and FIG. 5B are schematic perspective views illustrating a magnetic memory apparatus according to the first embodiment.

FIG. 5A corresponds to the second operation OP2. FIG. 5B corresponds to the first operation OP1.

As shown in FIG. 5B, the first stacked body SB1 is provided in the magnetic memory apparatus 111 according to the embodiment as well. The controller 70 (referring to FIG. 1) may be further provided. The controller 70 is not illustrated in FIG. 5A and FIG. 5B. The first conductive layer 21, the first transistor Tr1, and the magnetic part (the first magnetic part 51 and the second magnetic part 52) are provided in the example. The magnetic memory apparatus 111 further includes a second stacked body SB2. Thus, multiple stacked bodies SB may be provided in the magnetic memory apparatus 111. The number of the multiple stacked bodies SB is arbitrary. The configurations of the first stacked body SB1, the controller 70, the first conductive layer 21, the first transistor Tr1, and the magnetic part of the magnetic memory apparatus 111 may be similar to those of the magnetic memory apparatus 110. The second stacked body SB2 which is one of the multiple stacked bodies SB is described below.

The second stacked body SB2 includes a second magnetic layer 12, a second counter magnetic layer 12c, and a second intermediate layer 12n. The second intermediate layer 12n is placed between the second magnetic layer 12 and the second counter magnetic layer 12c; and the second intermediate layer 12n is nonmagnetic. The same configurations (including the materials) as the first magnetic layer 11, the first counter magnetic layer 11c, and the first intermediate layer 11n are applicable respectively to the second magnetic layer 12, the second counter magnetic layer 12c, and the second intermediate layer 12n.

For example, the first conductive layer 21 further includes a fourth part 21d and a fifth part 21e in addition to the first to third parts 21a to 21c. The second part 21b is placed between the first part 21a and the fifth part 21e. The fourth part 21d is placed between the second part 21b and the fifth part 21e. The second counter magnetic layer 12c is placed between the fourth part 21d and the second magnetic layer 12.

The controller 70 can further perform the operation of supplying second pulse current Ip2 including a constant-current period (a second constant-current period) to the second stacked body SB2. For example, this operation may be considered to be the first operation OP1.

A third electrical resistance value of the second stacked body SB2 before supplying the second pulse current Ip2 is different from a fourth electrical resistance value of the second stacked body SB2 after supplying the second pulse current Ip2. For example, the third electrical resistance value is higher than the fourth electrical resistance value. Operations similar to those of the first stacked body SB1 are performed also for the second stacked body SB2.

For example, the electrical resistance value of the second stacked body SB2 changes according to the angle between the orientation of magnetization 12M of the second magnetic layer 12 and the orientation of magnetization 12cM of the second counter magnetic layer 12c.

By supplying the second pulse current Ip2 including the constant-current period, the return from the state of the fourth electrical resistance value (e.g., the "parallel" second state ST2) to the state of the third electrical resistance value (e.g., the "antiparallel" first state ST1) is suppressed.

A second transistor Tr2 may be further provided in the magnetic memory apparatus 111. Similarly to the first transistor Tr1, the second transistor Tr2 is electrically connected to the controller 70. The second transistor Tr2 is electrically connected to the second magnetic layer 12. The controller 70 supplies the second pulse current Ip2 to the second stacked body SB2 via the second transistor Tr2.

As shown in FIG. 5B, a negative charge q1 and a positive charge q2 are generated in the first stacked body SB1 to which the first pulse current Ip1 is supplied. The negative charge q1 is generated in the first magnetic layer 11. The positive charge q2 is generated in the first counter magnetic layer 11c. For example, the potential barrier is reduced by the charge.

The transistor Tr may be provided for each of the multiple stacked bodies SB. The controller 70 is electrically connected to each of the multiple stacked bodies SB via the transistors Tr. The controller 70 is electrically connected to the fifth part 21e and a part 26 of the first conductive layer 21.

As shown in FIG. 5A, the second operation OP2 may be performed before the operation (e.g., the first operation OP1) illustrated in FIG. 5B. In the second operation OP2, the controller 70 supplies the conductive layer current Is between the second part 21b and the fifth part 21e. For example, a spin torque 28 due to the spin Hall effect in the first conductive layer 21 acts on the first counter magnetic layer 11c, the second counter magnetic layer 12c, etc.

For example, negative voltage Vneg is applied to the magnetic layers of the multiple stacked bodies SB. For example, the negative voltage Vneg is applied to the first magnetic layer 11 of the first stacked body SB1. For example, the negative voltage Vneg is applied to the second magnetic layer 12 of the second stacked body SB2.

Thereby, the first state ST1 (the state of the third electrical resistance value) is obtained in the second stacked body SB2. For example, the first state ST1 (the "antiparallel" state) is formed in the multiple stacked bodies SB. Subsequently, the first operation OP1 may be performed for any one or more of the multiple stacked bodies SB according to the information to be stored.

Second Embodiment

Figures 6A, 6B:
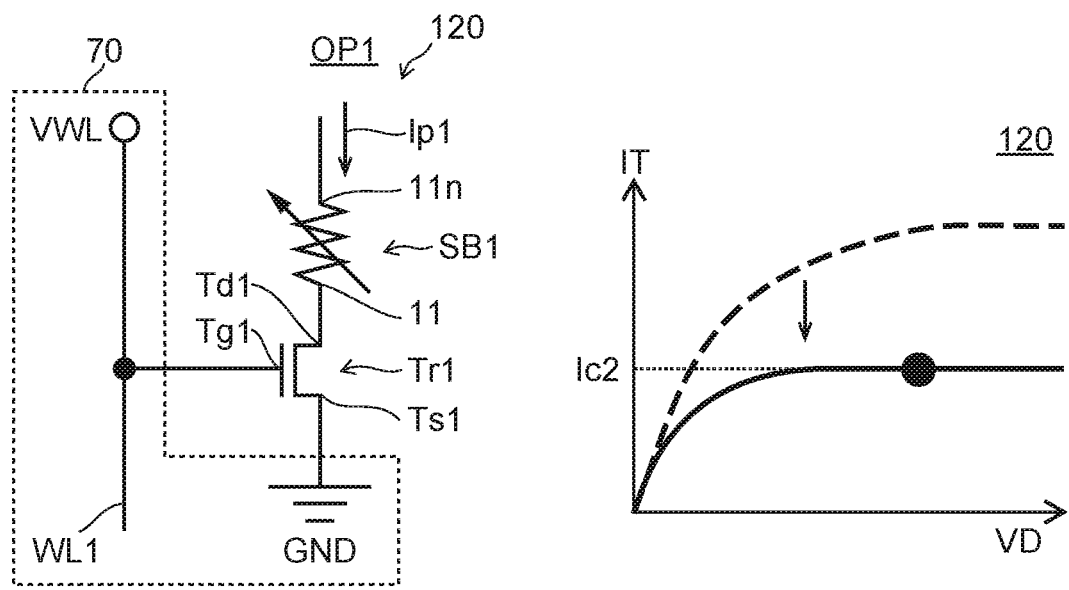
FIG. 6A and FIG. 6B are schematic views illustrating a magnetic memory apparatus according to a second embodiment.

FIG. 6A and FIG. 6B are schematic views illustrating a magnetic memory apparatus according to a second embodiment.

FIG. 6A is an equivalent circuit diagram of a part of the magnetic memory apparatus 120. FIG. 6B is a graph illustrating an operation.

As shown in FIG. 6A, the magnetic memory apparatus 120 according to the second embodiment also includes the first stacked body SB1, the first transistor Tr1, and the controller 70 (referring to FIG. 1). The first conductive layer 21 and the magnetic part (the first magnetic part 51 and the second magnetic part 52) may be provided.

In the magnetic memory apparatus 120 as well, the first stacked body SB1 includes the first magnetic layer 11, the first counter magnetic layer 11c, and the nonmagnetic first intermediate layer 11n placed between the first magnetic layer 11 and the first counter magnetic layer 11c (referring to FIG. 1).

In FIG. 6A, the first transistor Tr1 is electrically connected to the first magnetic layer 11. For example, the first transistor Tr1 may be most proximal to the first stacked body SB1 among the multiple transistors electrically connected to the first stacked body SB1.

The controller 70 is electrically connected to the first transistor Tr1 and the first counter magnetic layer 11c. In the case that the first conductive layer 21 is provided, the controller 70 is electrically connected to the first transistor Tr1 and the first conductive layer 21.

For example, the first drain Td1 of the first transistor Tr1 is electrically connected to the first magnetic layer 11. The first source Ts1 is electrically connected to a ground GND. The first gate Tg1 is electrically connected to a word line WL1. The ground GND and the word line WL1 can be considered to be a part of the controller 70. Voltage VWL is applied to the word line WL1.

The controller 70 is configured to perform the first operation OP1 of supplying the first pulse current Ip1 to the first stacked body SB1 via the first transistor Tr1.

In the magnetic memory apparatus 120, the first transistor Tr1 operates in a saturated region. The first electrical resistance value of the first stacked body SB1 before supplying the first pulse current Ip1 is different from the second electrical resistance value of the first stacked body SB1 after supplying the first pulse current Ip1. For example, the first electrical resistance value is higher than the second electrical resistance value.

In the magnetic memory apparatus 120, the first transistor Tr1 operates in the saturated region. Thereby, the first pulse current Ip1 substantially includes a constant-current period. For example, other than the rise period and the fall period, the first pulse current Ip1 is substantially constant current. Thereby, the return to the first state after transitioning from the first state to the second state can be suppressed. Thereby, a magnetic memory apparatus can be provided in which stable operations are available.

FIG. 6B illustrates the current-voltage characteristics of the first transistor Tr1. In FIG. 6B, the horizontal axis corresponds to drain voltage VD of the first transistor Tr1. The vertical axis is current IT between the drain and the source of the first transistor Tr1. The characteristics of the broken line illustrated in FIG. 6B is obtained in the case that the voltage VWL of the word line WL1 connected to the first gate Tg1 is high. The characteristics of the solid line illustrated in FIG. 6B are obtained in the case that the voltage VWL is low.

In the magnetic memory apparatus 120, the voltage VWL is set to be low. Thereby, for example, the first transistor Tr1 operates in the saturated region. In the saturated region, the value of the current IT is substantially constant regardless of the drain voltage. For example, the current IT becomes the second current value Ic2 illustrated in FIG. 2A. The constant-current first pulse current Ip1 is supplied to the first stacked body SB1 by the first transistor Tr1.

In the first and second embodiments described above, the first magnetic layer 11 includes, for example, at least one selected from the group consisting of Fe, Co, and Ni. The first magnetic layer 11 may include, for example, at least one selected from the group consisting of a Ni—Fe alloy, a Co—Fe alloy, a Co—Ni alloy, and a Co—Fe—Ni alloy. The first magnetic layer 11 may include, for example, at least one selected from the group consisting of a (Co, Fe, Ni)—(Si, B)-based material, a (Co, Fe, Ni)—(Si, B)—(P, Al, Mo, Nb, Mn)-based material, and a Co—(Zr, Hf, Nb, Ta, Ti)-based material. The first magnetic layer 11 may include, for example, an amorphous material. The first magnetic layer 11 may include, for example, a Heusler alloy. For example, the Heusler alloy may have a substantially "$X_2YZ$" composition. "X" is, for example, Co; "Y" is, for example, at least one selected from the group consisting of V, Cr, Mn, and Fe; and "Z" is at least one selected from the group consisting of Al, Si, Ga, and Ge. The first magnetic layer 11 may include a stacked film including multiple films including the materials described above. The first magnetic layer 11 may include, for example, an alloy including at least one selected from the group consisting of FePt, CoPt, CoCrPt, and (Co, Fe, Ni)—(Pt, Ir, Pd, Rh)—(Cr, Hf, Zr, Ti, Al, Ta, Nb). The first magnetic layer 11 may include, for example, a stacked film including (Co, Fe)/(Pt, Ir, Pd).

The first counter magnetic layer 11c includes, for example, at least one selected from the group consisting of Fe, Co, and Ni. The first counter magnetic layer 11c may include, for example, at least one selected from the group consisting of a Ni—Fe alloy, a Co—Fe alloy, a Co—Ni alloy, and a Co—Fe—Ni alloy. The first counter magnetic layer 11c may include, for example, at least one selected from the group consisting of a (Co, Fe, Ni)—(Si, B)-based material, a (Co, Fe, Ni)—(Si, B)—(P, Al, Mo, Nb, Mn)-based material, and a Co—(Zr, Hf, Nb, Ta, Ti)-based material. The first counter magnetic layer 11c may include, for example, an amorphous material. The first counter magnetic layer 11c may include, for example, a Heusler alloy. For example, the Heusler alloy may have a substantially "$X_2YZ$" composition. "X" is Co; "Y" is at least one selected from the group consisting of V, Cr, Mn, and Fe; and "Z" is at least one selected from the group consisting of Al, Si, Ga, and Ge. The first counter magnetic layer 11c may include a stacked film including multiple films including the materials described above. The first counter magnetic layer 11c may include, for example, an alloy including at least one selected from the group consisting of FePt, CoPt, CoCrPt, and (Co, Fe, Ni)—(Pt, Ir, Pd, Rh)—(Cr, Hf, Zr, Ti, Al, Ta, Nb). The first counter magnetic layer 11c may include, for example, a stacked film including (Co, Fe)/(Pt, Ir, Pd).

The first intermediate layer 11n includes, for example, MgO. The first intermediate layer 11n may include, for example, at least one selected from the group consisting of $Al_2O_3$ (aluminum oxide), $SiO_2$ (silicon oxide), MgO (magnesium oxide), AlN (aluminum nitride), SiN (silicon nitride), $Bi_2O_3$ (bismuth oxide), $MgF_2$ (magnesium fluoride), $CaF_2$ (calcium fluoride), $SrTiO_3$ (strontium titanate), $LaAlO_3$ (lanthanum aluminate), Al—N—O (aluminum oxynitride), and HfO (hafnium oxide). The first intermediate layer 11n may include, for example, a combined film including the materials described above. The first intermediate layer 11n may include, for example, at least one selected from the group consisting of copper, silver, gold, vanadium, chrome, and ruthenium. The first intermediate layer 11n may include, for example, a combined film including an insulating body and a nonmagnetic body.

In the embodiment, for example, the orientation of the magnetization 11M of the first magnetic layer 11 is substantially fixed. For example, the orientation of the magnetization 11cM of the first counter magnetic layer 11c is changeable. The change of the electrical resistance value of the first stacked body SB1 is dependent on the orientation of the magnetization 11cM of the first counter magnetic layer 11c. For example, the electrical resistance value of the first stacked body SB1 corresponds to the electrical resistance value between the first magnetic layer 11 and the first counter magnetic layer 11c.

In the example shown in FIG. 1, the length along the Y-axis direction of the first stacked body SB1 is longer than the length along the X-axis direction of the first stacked body SB1. In the embodiment, the length along the X-axis direction of the first stacked body SB1 may be longer than the length along the Y-axis direction of the first stacked body SB1.

The shape of the first stacked body SB1 in the X-Y plane may be polygonal or flattened-circular (including elliptical).

At least one of the magnetization 11M of the first magnetic layer 11 or the magnetization 11cM of the first counter magnetic layer 11c may have a component along the X-Y plane. At least one of the magnetization 11M of the first magnetic layer 11 or the magnetization 11cM of the first counter magnetic layer 11c may have a component along the Z-axis direction. For example, at least one of the first magnetic layer 11 or the first counter magnetic layer 11c may include a perpendicular magnetization film. In such a case, the length along the Y-axis direction of the first stacked body SB1 may be the same as the length along the X-axis direction of the first stacked body SB1. The shape of the first stacked body SB1 in the X-Y plane may be polygonal or circular.

Figure 7:
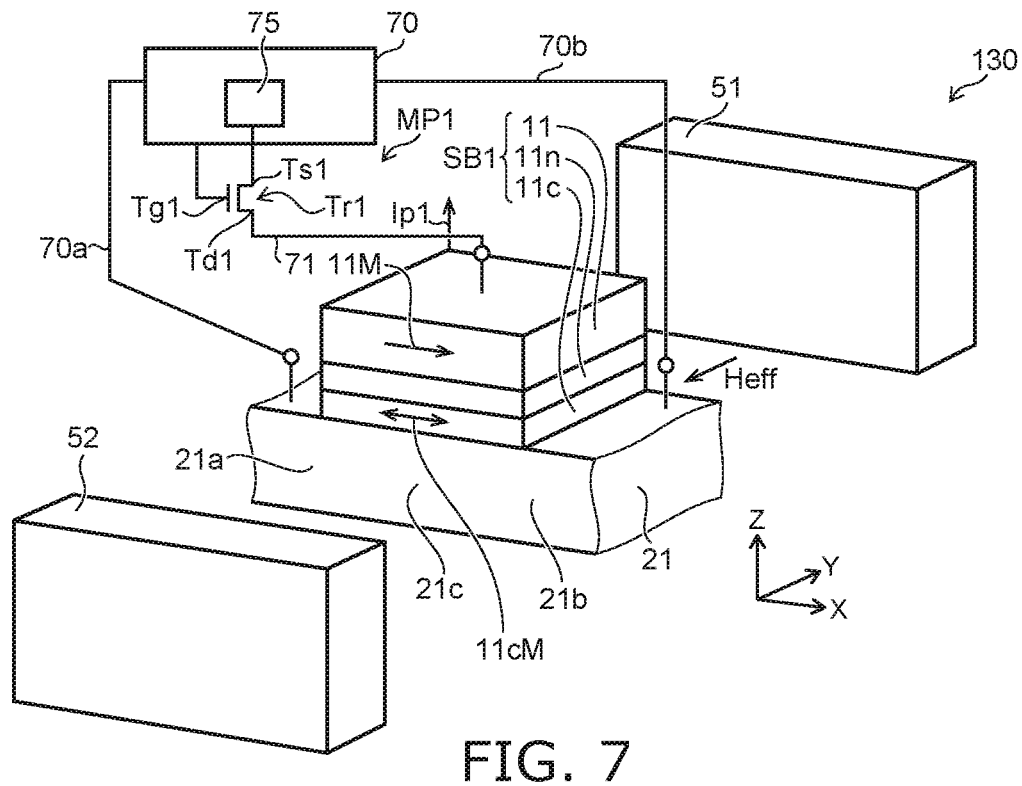
FIG. 7 is a schematic perspective view illustrating a magnetic memory apparatus according to the embodiment.
Figure 8:
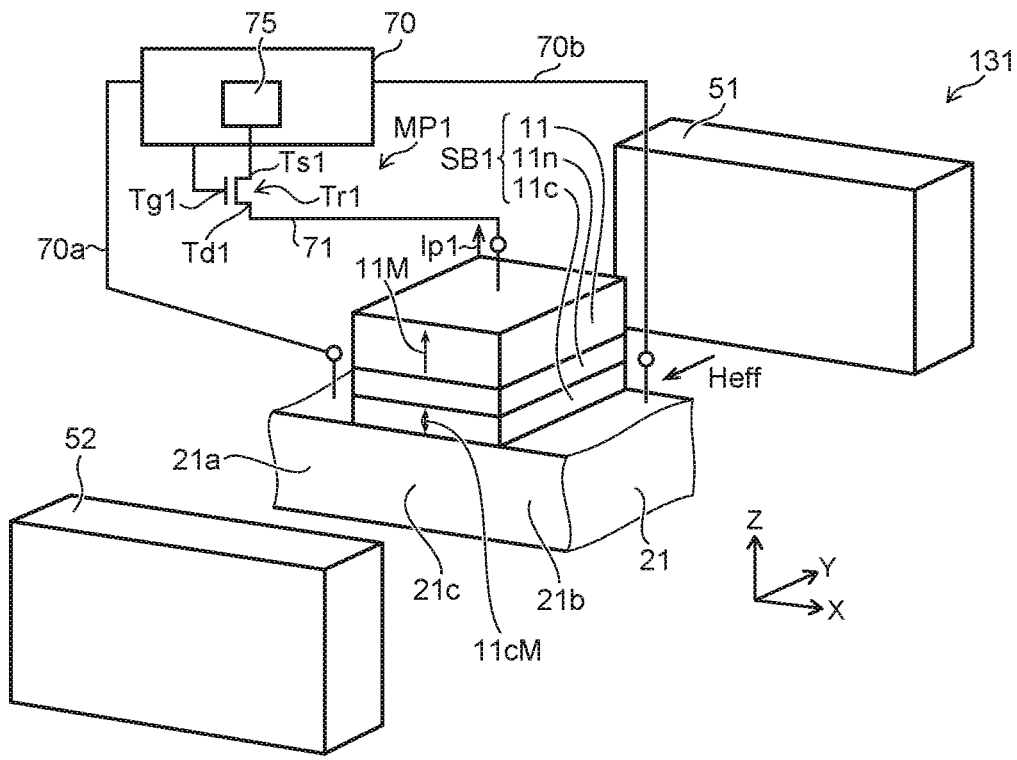
FIG. 8 is a schematic perspective view illustrating a magnetic memory apparatus according to the embodiment.
Figure 9:
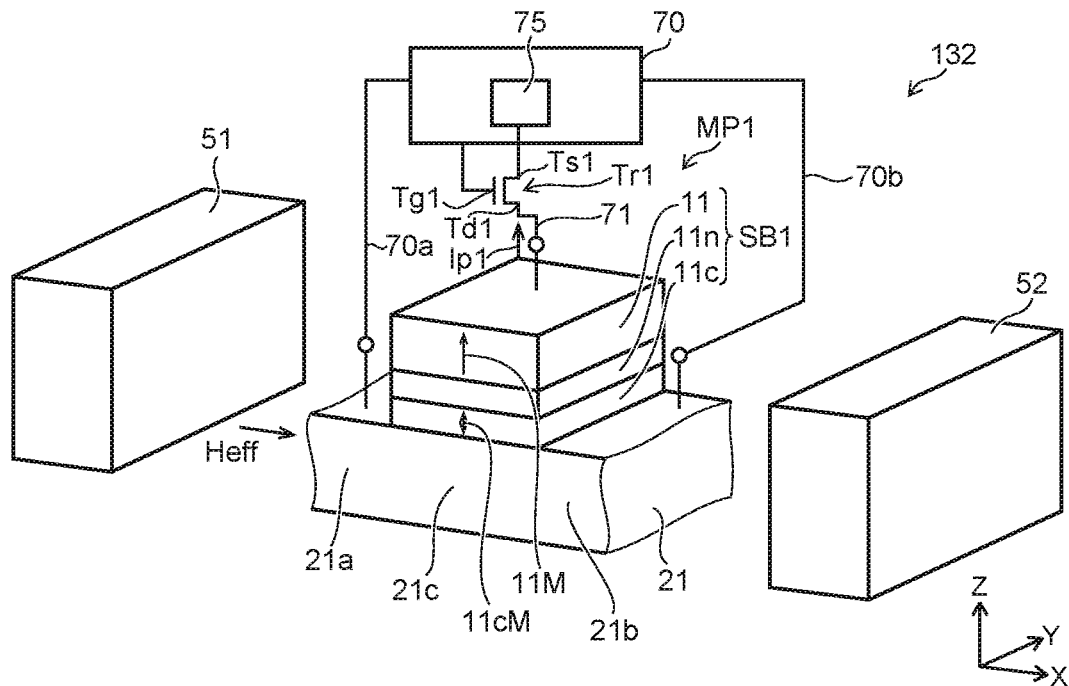
FIG. 9 is a schematic perspective view illustrating a magnetic memory apparatus according to the embodiment.

FIG. 7 to FIG. 9 are schematic perspective views illustrating magnetic memory apparatuses according to the embodiment.

In a magnetic memory apparatus 130 as shown in FIG. 7, the direction of the magnetic field Heff crosses the second direction (e.g., the X-axis direction) from the first part 21a to the second part 21b of the first conductive layer 21. In the example, the direction of the magnetic field Heff is aligned with the Y-axis direction. For example, the direction from the second magnetic part 52 to the first magnetic part 51 crosses a plane (the Z-X plane) including the first direction and the second direction. In the magnetic memory apparatus 130, the magnetization 11M of the first magnetic layer 11 is aligned with the X-axis direction. The magnetization 11cM of the first counter magnetic layer 11c is aligned with the X-axis direction.

In a magnetic memory apparatus 131 as shown in FIG. 8, the direction of the magnetic field Heff crosses the second direction from the first part 21a to the second part 21b. For example, the direction from the second magnetic part 52 to the first magnetic part 51 crosses a plane (the Z-X plane) including the first direction and the second direction.

In a magnetic memory apparatus 132 as shown in FIG. 9, the direction of the magnetic field Heff is aligned with the second direction from the first part 21a to the second part 21b. For example, the direction from the second magnetic part 52 to the first magnetic part 51 is aligned with the second direction.

In the magnetic memory apparatuses 131 and 132, the magnetization 11M of the first magnetic layer 11 is aligned with the Z-axis direction. The magnetization 11cM of the first counter magnetic layer 11c is aligned with the Z-axis direction.

The configurations (including the materials) described in reference to the magnetic memory apparatuses 110, 111, or 120 described above are applicable to the magnetic memory apparatuses 130 to 132.

The embodiments include the following configurations (e.g., technological proposals).

Configuration 1

A magnetic memory apparatus, comprising:
a first stacked body including
a first magnetic layer,
a first counter magnetic layer, and
a first intermediate layer placed between the first magnetic layer and the first counter magnetic layer, the first intermediate layer being nonmagnetic; and
a controller electrically connected to the first magnetic layer and the first counter magnetic layer,
the controller being configured to perform a first operation of supplying first pulse current to the first stacked body, the first pulse current including a first constant-current period,
a first electrical resistance value of the first stacked body before the supply of the first pulse current being different from a second electrical resistance value of the first stacked body after the supply of the first pulse current.

Configuration 2

A magnetic memory apparatus, comprising:
a first stacked body including
a first magnetic layer,
a first counter magnetic layer, and
a first intermediate layer placed between the first magnetic layer and the first counter magnetic layer, the first intermediate layer being nonmagnetic;
a first transistor electrically connected to the first magnetic layer; and
a controller electrically connected to the first transistor and the first counter magnetic layer,
the controller being configured to perform a first operation of supplying first pulse current to the first stacked body via the first transistor,
the first transistor operating in a saturated region,
a first electrical resistance value of the first stacked body before the supply of the first pulse current being different from a second electrical resistance value of the first stacked body after the supply of the first pulse current.

Configuration 3

The magnetic memory apparatus according to Configuration 1 or 2, wherein the first electrical resistance value is higher than the second electrical resistance value.

Configuration 4

The magnetic memory apparatus according to any one of Configurations 1 to 3, wherein
a magnitude of the first pulse current changes from a first current value to a second current value between first time and second time, the second time being after the first time,
the magnitude of the first pulse current is substantially constant between the second time and third time, the third time being after the second time, and
the magnitude of the first pulse current changes from the second current value to the first current value between the third time and fourth time, the fourth time being after the third time.

Configuration 5

The magnetic memory apparatus according to any one of Configurations 1 to 3, wherein
a magnitude of the first pulse current changes from a first current value to a second current value between first time and second time, the second time being after the first time,
an absolute value of a difference between the second current value and the magnitude of the first pulse current between the second time and third time is less than 1/10 of an absolute value of a difference between the first current value and the second current value, the third time being after the second time, and
the magnitude of the first pulse current changes from the second current value to the first current value between the third time and fourth time, the fourth time being after the third time.

Configuration 6

The magnetic memory apparatus according to Configuration 4 or 5, wherein
an electrical resistance value of the first stacked body changes from the first electrical resistance value to the second electrical resistance value between fifth time and sixth time, the fifth time being between the second time and the third time, the sixth time being between the third time and the fifth time, and
the electrical resistance value of the first stacked body is substantially constant between the sixth time and the fourth time.

Configuration 7

The magnetic memory apparatus according to Configuration 4 or 5, wherein
an electrical resistance value of the first stacked body changes from the first electrical resistance value to the second electrical resistance value between fifth time and sixth time, the fifth time being between the second time and the third time, the sixth time being between the fifth time and the third time, and
the electrical resistance value of the first stacked body does not increase between the sixth time and the fourth time.

Configuration 8

The magnetic memory apparatus according to any one of Configurations 4 to 7, wherein
Device voltage between the first magnetic layer and the first counter magnetic layer is first voltage between the second time and the fifth time, the fifth time being between the second time and the third time,
the device voltage is second voltage between the sixth time and the third time, the sixth time being between the fifth time and the third time, and
an absolute value of the second voltage is less than an absolute value of the first voltage.

Configuration 9

The magnetic memory apparatus according to Configuration 8, wherein the device voltage is third voltage before the first time, and an absolute value of a difference between the third voltage and the first voltage is greater than an absolute value of a difference between the third voltage and the second voltage.

Configuration 10

The magnetic memory apparatus according to any one of Configurations 1 to 9, further comprising a magnetic part configured to apply a magnetic field to the first stacked body, the magnetic field having a component crossing a direction from the first counter magnetic layer to the first magnetic layer.

Configuration 11

The magnetic memory apparatus according to any one of Configurations 1 to 10, further comprising a first conductive layer including a first part, a second part, and a third part placed between the first part and the second part, the first counter magnetic layer being placed between the third part and the first magnetic layer, the first conductive layer being electrically connected to the first counter magnetic layer, the controller being electrically connected to the first conductive layer, the first pulse current being negative based on potential of the first conductive layer.

Configuration 12

The magnetic memory apparatus according to Configuration 11, wherein the controller is configured to further perform a second operation, in the second operation, the controller supplies conductive layer current between the first part and the second part, and the first operation is performed after the second operation.

Configuration 13

The magnetic memory apparatus according to Configuration 12, wherein in the second operation, the controller sets the first magnetic layer to potential and supplies the conductive layer current, the potential being negative based on the potential of the first conductive layer.

Configuration 14

The magnetic memory apparatus according to any one of Configurations 11 to 13, wherein the first conductive layer is connected to the first counter magnetic layer.

Configuration 15

The magnetic memory apparatus according to any one of Configurations 11 to 14, wherein the first conductive layer includes at least one selected from the group consisting of Hf, Ta, W, Re, Os, Ir, Pt, Au, Bi, Pd, Cu, and Ag.

Configuration 16

The magnetic memory apparatus according to any one of Configurations 11 to 15, wherein a first direction from the first counter magnetic layer to the first magnetic layer crosses a second direction from the first part to the second part, and magnetization of the first magnetic layer crosses a plane including the first direction and the second direction.

Configuration 17

The magnetic memory apparatus according to any one of Configurations 11 to 16, further comprising a magnetic part configured to apply a magnetic field to the first stacked body, the magnetic field being aligned with a direction passing through the first part and the second part.

Configuration 18

The magnetic memory apparatus according to any one of Configurations 11 to 17, further comprising a second stacked body, the second stacked body including:
a second magnetic layer;
a second counter magnetic layer; and
a second intermediate layer placed between the second magnetic layer and the second counter magnetic layer, the second intermediate layer being nonmagnetic, the first conductive layer further including a fourth part and a fifth part, the second part being placed between the first part and the fifth part, the fourth part being placed between the second part and the fifth part, the second counter magnetic layer being placed between the fourth part and the second magnetic layer, the controller being configured to further perform an operation of supplying second pulse current to the second stacked body, the second pulse current including a second constant-current period, a third electrical resistance value of the second stacked body before the supply of the second pulse current being different from a fourth electrical resistance value of the second stacked body after the supply of the second pulse current.

Configuration 19

The magnetic memory apparatus according to Configuration 18, wherein in the second operation, the controller supplies the conductive layer current between the second part and the fifth part, and the first operation is performed after the second operation.

Configuration 20

The magnetic memory apparatus according to Configuration 19, wherein the operation of supplying the second pulse current to the second stacked body is performed after the second operation.

According to the embodiments, a magnetic memory apparatus can be provided in which stable operations are available.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory apparatuses such as magnetic layers, intermediate layers, stacked bodies, magnetic parts, transistors, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory apparatuses practicable by an appropriate design modification by one skilled in the art based on the magnetic memory apparatuses described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory apparatus, comprising:
   a first stacked body including
      a first magnetic layer,
      a first counter magnetic layer, and
      a first intermediate layer placed between the first magnetic layer and the first counter magnetic layer, the first intermediate layer being nonmagnetic; and
   a first magnetic part;
   a second magnetic part, the first stacked body being provided between the first magnetic part and the second magnetic part in a direction crossing a first direction from the first counter magnetic layer to the first magnetic layer; and
   a controller electrically connected to the first magnetic layer and the first counter magnetic layer,
   the controller being configured to perform a first operation of supplying first pulse current to the first stacked body, the first pulse current including a first constant-current period,
   a first electrical resistance value of the first stacked body before the supply of the first pulse current, the first electrical resistance value being different from a second electrical resistance value of the first stacked body after the supply of the first pulse current,
   wherein
      a magnitude of the first pulse current changes from a first current value to a second current value between first time and second time, the second time being after the first time,
      an absolute value of a difference between the second current value and the magnitude of the first pulse current between the second time and third time is less than 1/10 of an absolute value of a difference between the first current value and the second current value, the third time being later than the second time, and
      the magnitude of the first pulse current changes from the second current value to the first current value between the third time and fourth time, the fourth time being later than the third time.

2. The apparatus according to claim 1, wherein the first electrical resistance value is higher than the second electrical resistance value.

3. The apparatus according to claim 1, wherein
   a magnitude of the first pulse current changes from a first current value to a second current value between first time and second time, the second time being after the first time,
   the magnitude of the first pulse current is constant between the second time and third time, the third time being after the second time, and
   the magnitude of the first pulse current changes from the second current value to the first current value between the third time and fourth time, the fourth time being after the third time.

4. The apparatus according to claim 3, wherein
   an electrical resistance value of the first stacked body changes from the first electrical resistance value to the second electrical resistance value between fifth time and sixth time, the fifth time being between the second time and the third time, the sixth time being between the third time and the fifth time, and
   the electrical resistance value of the first stacked body is constant between the sixth time and the fourth time.

5. The apparatus according to claim 3, wherein
   an electrical resistance value of the first stacked body changes from the first electrical resistance value to the second electrical resistance value between fifth time and sixth time, the fifth time being between the second time and the third time, the sixth time being between the fifth time and the third time, and
   the electrical resistance value of the first stacked body does not increase between the sixth time and the fourth time.

6. The apparatus according to claim 3, wherein
   device voltage between the first magnetic layer and the first counter magnetic layer is first voltage between the second time and a fifth time, the fifth time being between the second time and the third time,
   the device voltage is second voltage between a sixth time and the third time, the sixth time being between the fifth time and the third time, and
   an absolute value of the second voltage is less than an absolute value of the first voltage.

7. The apparatus according to claim 6, wherein
   the device voltage is third voltage before the first time, and
   an absolute value of a difference between the third voltage and the first voltage is greater than an absolute value of a difference between the third voltage and the second voltage.

8. The apparatus according to claim 1, wherein the first magnetic part and the second magnetic part are configured to apply a magnetic field to the first stacked body,
   the magnetic field having a component crossing the first direction.

9. A magnetic memory apparatus, comprising:
   a first stacked body including
      a first magnetic layer,
      a first counter magnetic layer, and
      a first intermediate layer placed between the first magnetic layer and the first counter magnetic layer, the first intermediate layer being nonmagnetic; and
   a first magnetic part;
   a second magnetic part, the first stacked body being provided between the first magnetic part and the second magnetic part in a direction crossing a first direction from the first counter magnetic layer to the first magnetic layer;
   a controller electrically connected to the first magnetic layer and the first counter magnetic layer; and
   a first conductive layer,
   the controller being configured to perform a first operation of supplying first pulse current to the first stacked body, the first pulse current including a first constant-current period,
   a first electrical resistance value of the first stacked body before the supply of the first pulse current, the first electrical resistance value being different from a second electrical resistance value of the first stacked body after the supply of the first pulse current, the first conductive layer including a first part, a second part, and a third part placed between the first part and the second part, the first counter magnetic layer being placed between the third part and the first magnetic layer, the first conductive layer being electrically connected to the first counter magnetic layer, the controller being electrically connected to the first conductive layer, the first pulse current being negative based on potential of the first conductive layer.

10. The apparatus according to claim 9, wherein the controller is configured to further perform a second operation, in the second operation, the controller supplies conductive layer current between the first part and the second part, and the first operation is performed after the second operation.

11. The apparatus according to claim 10, wherein in the second operation, the controller sets the first magnetic layer to potential and supplies the conductive layer current, the potential being negative based on the potential of the first conductive layer.

12. The apparatus according to claim 9, wherein the first conductive layer is connected to the first counter magnetic layer.

13. The apparatus according to claim 9, wherein the first conductive layer includes at least one selected from the group consisting of Hf, Ta, W, Re, Os, Ir, Pt, Au, Bi, Pd, Cu, and Ag.

14. The apparatus according to claim 9, wherein the first direction crosses a second direction from the first part to the second part, and magnetization of the first magnetic layer crosses a plane including the first direction and the second direction.

15. The apparatus according to claim 9, further comprising a second stacked body, the second stacked body including:
 a second magnetic layer;
 a second counter magnetic layer; and
 a second intermediate layer placed between the second magnetic layer and the second counter magnetic layer, the second intermediate layer being nonmagnetic, the first conductive layer further including a fourth part and a fifth part, the second part being placed between the first part and the fifth part, the fourth part being placed between the second part and the fifth part, the second counter magnetic layer being placed between the fourth part and the second magnetic layer, the controller being configured to further perform an operation of supplying second pulse current to the second stacked body, the second pulse current including a second constant-current period, a third electrical resistance value of the second stacked body before the supply of the second pulse current being different from a fourth electrical resistance value of the second stacked body after the supply of the second pulse current.

16. The apparatus according to claim 15, wherein in the second operation, the controller supplies the conductive layer current between the second part and the fifth part, and the first operation is performed after the second operation.

17. The apparatus according to claim 16, wherein the operation of supplying the second pulse current to the second stacked body is performed after the second operation.

* * * * *

UNITED STATES PATENT AND TRADEMARK OFFICE
CERTIFICATE OF CORRECTION

PATENT NO. : 10,916,281 B2  
APPLICATION NO. : 16/299861  
DATED : February 9, 2021  
INVENTOR(S) : Hideyuki Sugiyama et al.

Page 1 of 1

It is certified that error appears in the above-identified patent and that said Letters Patent is hereby corrected as shown below:

On the Title Page

Item (74), in the Attorney, Agent, or Firm, Line 1, "Finneean," should read --Finnegan,--.

Signed and Sealed this  
Twenty-ninth Day of June, 2021

Drew Hirshfeld  
*Performing the Functions and Duties of the  
Under Secretary of Commerce for Intellectual Property and  
Director of the United States Patent and Trademark Office*